US012597939B2

(12) United States Patent
Peting

(10) Patent No.: US 12,597,939 B2
(45) Date of Patent: Apr. 7, 2026

(54) CURRENT DRIVE MODE DIGITAL-TO-ANALOG CONVERTER PREFILTER FOR REDUCED PULSE WIDTH MODULATION CONTROL DRIVE

(71) Applicant: SKYWORKS SOLUTIONS, INC., Irvine, CA (US)

(72) Inventor: Mark R. Peting, Yamhill, OR (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 176 days.

(21) Appl. No.: 18/544,630

(22) Filed: Dec. 19, 2023

(65) Prior Publication Data

US 2024/0204790 A1 Jun. 20, 2024

Related U.S. Application Data

(60) Provisional application No. 63/476,286, filed on Dec. 20, 2022.

(51) Int. Cl.
| | |
|---|---|
| *H03M 1/12* | (2006.01) |
| *H03M 1/06* | (2006.01) |
| *H03M 1/18* | (2006.01) |
| *H03M 1/46* | (2006.01) |

(52) U.S. Cl.
CPC ......... *H03M 1/0626* (2013.01); *H03M 1/181* (2013.01); *H03M 1/462* (2013.01)

(58) Field of Classification Search
CPC ........... H03F 2200/03; H03F 2200/351; H03F 3/187; H03F 3/217; H03F 3/2175; H03F 3/183; H03F 3/45475; H03F 1/34; H03F 3/2171; H03F 2200/331; H03F 3/185; H03F 1/26; H03F 1/0255; H03F 1/3264; H03F 2200/372; H03F 2200/342; H03F 2200/339; H03F 2200/165; H03F 3/45968; H03F 2203/45048; H03F 2200/375; H03M 3/458; H03M 1/0626; H03M 1/822; H03M 3/506; H03M 3/50; H03M 1/0612; H03M 3/344; H03M 3/388; H03M 3/436; H03M 3/45; H03M 3/454; H03M 1/0602; H03M 1/0668; H03M 1/1235; H03M 1/74; H03M 7/3006; H03M 3/504; H03M 7/3033; H03M 3/466
USPC ......................................... 341/110, 118–121
See application file for complete search history.

(56) References Cited

U.S. PATENT DOCUMENTS

| | | | | |
|---|---|---|---|---|
| 6,381,154 | B1 * | 4/2002 | Nguyen ................ | H02M 3/156 323/280 |
| 9,887,672 | B1 * | 2/2018 | Kuo .................... | H03F 3/45475 |
| 9,912,348 | B1 * | 3/2018 | Baringer ............. | H04B 1/0014 |
| 2008/0042745 | A1 * | 2/2008 | Kozak .................... | H03F 3/217 330/251 |

(Continued)

*Primary Examiner* — Linh V Nguyen
(74) *Attorney, Agent, or Firm* — Lando & Anastasi, LLP

(57) ABSTRACT

This disclosure relates to a feedback loop circuit for an electrical signal. The feedback loop comprises a first branch having a first switch and a second switch, the first branch to receive an input signal and provide a first signal based on the input signal to a first adder and to provide a second signal based on the input signal to a second adder; and a second branch having a feedback line coupled between a third switch and the first adder, the second branch to provide an output signal based on the first signal and the second signal.

19 Claims, 6 Drawing Sheets

(56)                        References Cited

U.S. PATENT DOCUMENTS

| | | | |
|---|---|---|---|
| 2010/0097139 A1* | 4/2010 | Nielsen | H03F 3/217 |
| | | | 330/251 |
| 2011/0068961 A1* | 3/2011 | Hashimoto | H03M 1/0836 |
| | | | 341/118 |
| 2019/0007010 A1* | 1/2019 | Høyerby | H03F 3/2173 |
| 2021/0103258 A1* | 4/2021 | Fujimoto | G05B 13/048 |
| 2022/0045687 A1* | 2/2022 | Kozlov | H03F 3/45475 |
| 2022/0217066 A1* | 7/2022 | Ujiie | H04L 69/40 |
| 2023/0102992 A1 | 3/2023 | Peting et al. | |
| 2024/0088844 A1* | 3/2024 | Botti | H03F 3/2173 |
| 2024/0429881 A1* | 12/2024 | Botti | H03F 3/2175 |

* cited by examiner

VOLTAGE DRIVE MODE

CURRENT DRIVE MODE

CURRENT DRIVE MODE DIGITAL-TO-ANALOG CONVERTER PREFILTER FOR REDUCED PULSE WIDTH MODULATION CONTROL DRIVE

CROSS-REFERENCE TO RELATED APPLICATIONS

This application claims priority under 35 U.S.C. § 119(e) to U.S. Provisional Application No. 63/476,286, titled CURRENT DRIVE MODE DAC PREFILTER FOR REDUCED PWMC DRIVE, filed on Dec. 20, 2022, which is incorporated by reference in its entirety for all purposes.

BACKGROUND

At least one example in accordance with the present disclosure relates generally to feedback loops for electric signals. Feedback loops are systems which use an output of the system as an input to the system.

SUMMARY

According to at least one aspect of the present disclosure a feedback loop circuit for an electrical signal is disclosed. The feedback loop comprises a first branch having a first switch and a second switch, the first branch to receive an input signal and provide a first signal based on the input signal to a first adder and to provide a second signal based on the input signal to a second adder; and a second branch having a feedback line coupled between a third switch and the first adder, the second branch to provide an output signal based on the first signal and the second signal.

In some examples, the output signal is further based on a first summed signal and a second summed signal, the first summed signal being based on the output signal and the first signal, and the second summed signal being based on the first summed signal and the second signal. In various examples, the first branch further comprises an equalizer to produce the second signal based on the input signal; and a digital filter to provide to a digital-to-analog converter (DAC) a filtered signal based on the second signal and at least one filtering characteristic of the load, the DAC being configured to convert the filtered signal into an analog signal and provide the analog signal to the first adder as the first signal. In many examples, the second branch comprises the first adder and the second adder; a filtering block coupled between the first adder and the second adder, the filtering block to filter the first summed signal and convert the first summed signal into a digital first summed signal, and provide the digital first summed signal to the second adder; a pulse width modulator (PWM) to provide the drive signal to the load based on the sum, at the second adder, of the digital first summed signal and the second signal; and an input network configured to receive the output signal and provide the output signal to the first adder.

In some examples, the filtering block comprises an analog loop filter coupled to the first adder, a successive approximation register analog-to-digital converter (SAR ADC) coupled to the analog loop filter, and a digital loop filter coupled to the SAR ADC and to the second adder. In various examples, the feedback loop further comprises a controller configured to control the first, second, and third switches, wherein controlling the first, second, and third switches includes controlling the first switch to be in a respective first position or a second position, the second switch to be in a respective first position or second position, and the third switch to be in a respective first position or second position. In many examples, in a current drive mode, the controller controls the first switch to couple the equalizer to the second adder, controls the second switch to couple the digital filter to the DAC, and controls the third switch to couple the PWM to the input network. In various examples, in the voltage drive mode, the controller controls the first switch to decouple an output of the equalizer from the second adder, decouple an output of the digital filter from an input of the DAC, and couple the load to the input network. In many examples, the first adder is configured to subtract the output signal from the first signal to produce the first summed signal.

According to at least one aspect of the present disclosure, a method for maintaining stability of a feedback loop circuit is disclosed. The method comprises receiving an input signal; splitting the input signal into a first part and a second part; processing the first part with a digital filter having at least one filtering characteristic based on one or more filtering characteristics of a load; combining the first part with an output signal to produce a first summed signal; combining the second part with the first summed signal to produce a drive signal; and driving a pulse width modulator (PWM) using the drive signal.

In various examples, the method further comprises passing the input signal through an equalizer to produce the second part of the input signal; and passing the second part through the digital filter to produce the first part. In some examples, the method further comprises converting the first part from digital to analog form; combining the first part in analog form with the output signal in analog form to produce the first summed signal; converting the first summed signal from analog to digital form; and combining the first summed signal in digital form with the second part to produce the drive signal. In various examples the PWM drives a load, and the load produces the output signal. In many examples, combining the first part and the output signal includes subtracting the output signal from the first part. In some examples, the method further comprises inverting the output signal. In various examples, the method further comprises converting the output signal from a current to an analog voltage waveform using an input network.

According to at least one aspect of the present disclosure, a feedback loop for reducing noise in an output signal provided by a pulse width modulator (PWM) is provided. The feedback loop comprises an input configured to receive an input signal; a plurality of supply rail connections selectively coupled to the PWM and configured to provide power to the PWM; an equalizer coupled to an adder, the equalizer configured to provide an equalized signal based on the input signal; a digital loop filter selectively coupled to a digital-to-analog converter (DAC), the digital loop filter configured to provide a filtered signal based on the equalized signal, the adder being further configured to provide a drive signal to the PWM based on the equalized signal, the filtered signal, and the output signal; and a controller configured to control the plurality of supply rail connections to selectively couple to the PWM based on an energy of the output signal.

In some examples, the plurality of supply rail connections includes a first supply rail connection corresponding to a first voltage and a second supply rail connection corresponding to a second voltage, the second voltage being greater than the first voltage, and the controller controls the first supply rail connection to selectively couple to the PWM responsive to the power of the output signal being below a threshold power level, and the controller controls the second supply rail connection to selectively couple to the PWM responsive to the power of the output signal being above a threshold power level. In various examples, the digital loop filter has a response characteristic matching a response characteristic of a load coupled to the PWM. In many examples, the digital loop filter's response characteristic reduces noise in the circuit, thereby reducing a frequency of the power of the output signal exceeding the threshold power level.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Figure 1:
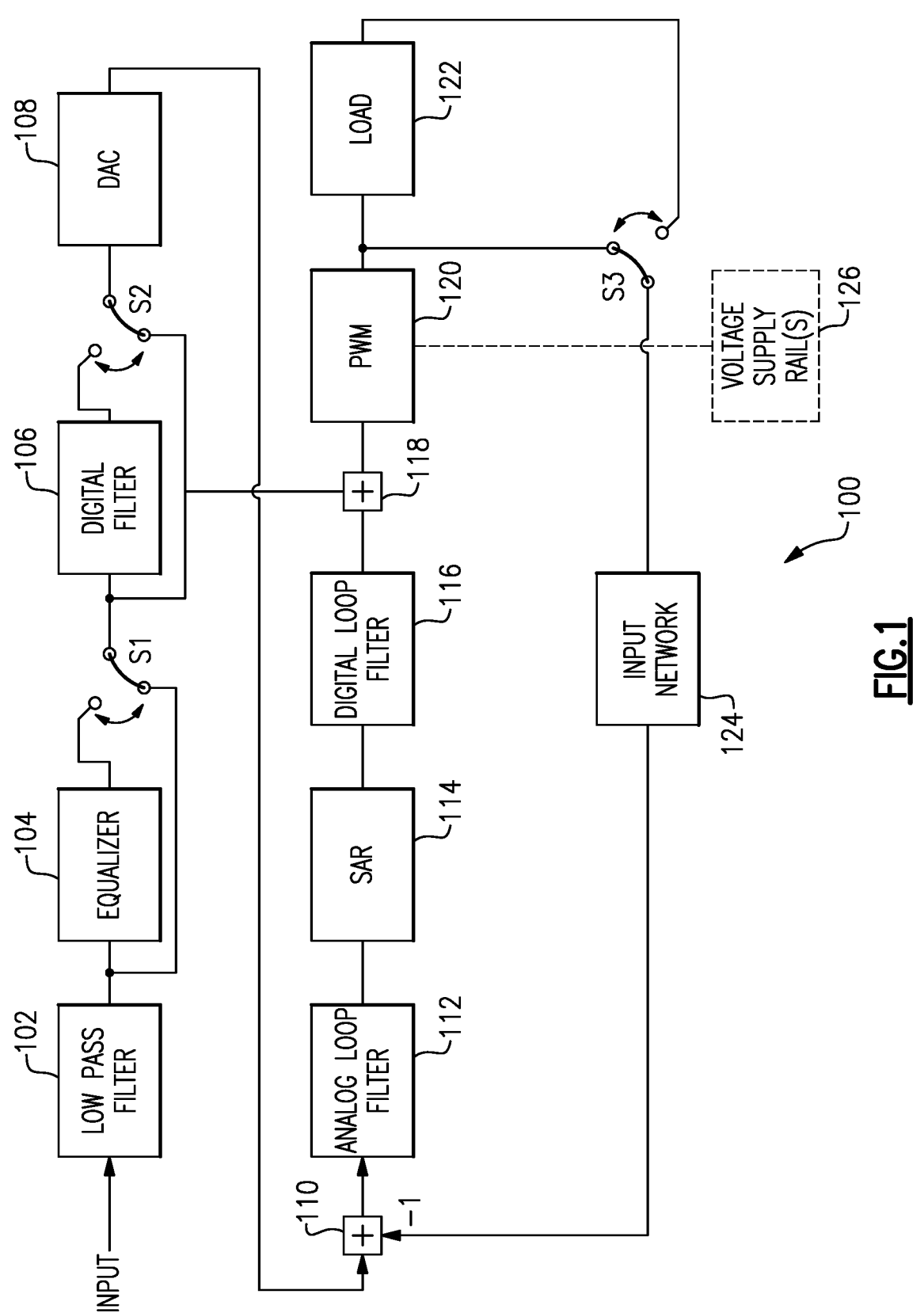
FIG. 1 illustrates a feedback loop according to an example.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items.

References to "or" may be construed as inclusive so that any terms described using "or" may indicate any of a single, more than one, and all of the described terms. In addition, in the event of inconsistent usages of terms between this document and documents incorporated herein by reference, the term usage in the incorporated features is supplementary to that of this document; for irreconcilable differences, the term usage in this document controls.

In various electronic applications, feedback loops may be used to control an electrical signal. For example, an electrical signal provided to a load may be controlled based in part on an input signal (or input value) and on the output signal (or output value). Feedback control of the output can be used to ensure the stability of the output. However, error (such as distortion and/or noise) at the output may destabilize the feedback loop and cause the output signal to vary outside of an acceptable range. In audio applications, as one example, variations in the output signal may result in audible hissing, popping, clicking, or other noises that make the listening experience unpleasant. In power applications, surges in current or voltage caused by errors may damage systems that are not rated for those voltage or current levels.

Loads may have inductive components, and, as a result may be seen by the circuit as impedances that vary with frequency in a manner that is proportionate to the inductance of the load. In some examples, where the feedback loop includes at least one loop filter intended to perform the inverse of the load response in one or more frequency regions, the loop filter may require a more powerful signal (i.e., a boosted signal) to provide the inverse response. In some cases, the boost will be related to the inductance of the load, with larger load inductances requiring larger boosts.

However, input signals into the feedback loop may include error (e.g., noise). The error may be multiplied by the loop filter, the load, and/or any other element of the feedback loop that performs amplification. As a result, the error may result in destabilization of the feedback loop and therefore error at the output to the load (e.g., popping, hissing, clicking in an audio application, or undesired current and/or voltage levels).

As one example of the above phenomena, if the main load response in a given frequency region is that of a low pass filter, the loop filter should be high pass to provide the inverse response. High frequency input noise at the input to the feedback loop would require a large boost to maintain the inverse response, which would multiply the error (e.g., noise), require a relatively large amount of power, and limit the noise floor.

This disclosure generally relates to eliminating the error in the feedback loop by using an additional filter. The additional filter matches the characteristics of the load. That is, if the load is a low pass filter, the additional filter (hereafter referred to as the "digital filter") is also a low pass filter and in at least some examples has the same filtering characteristics as the load (e.g., matching angle frequency, matching gain and/or attenuation, and so forth).

Figure 2:
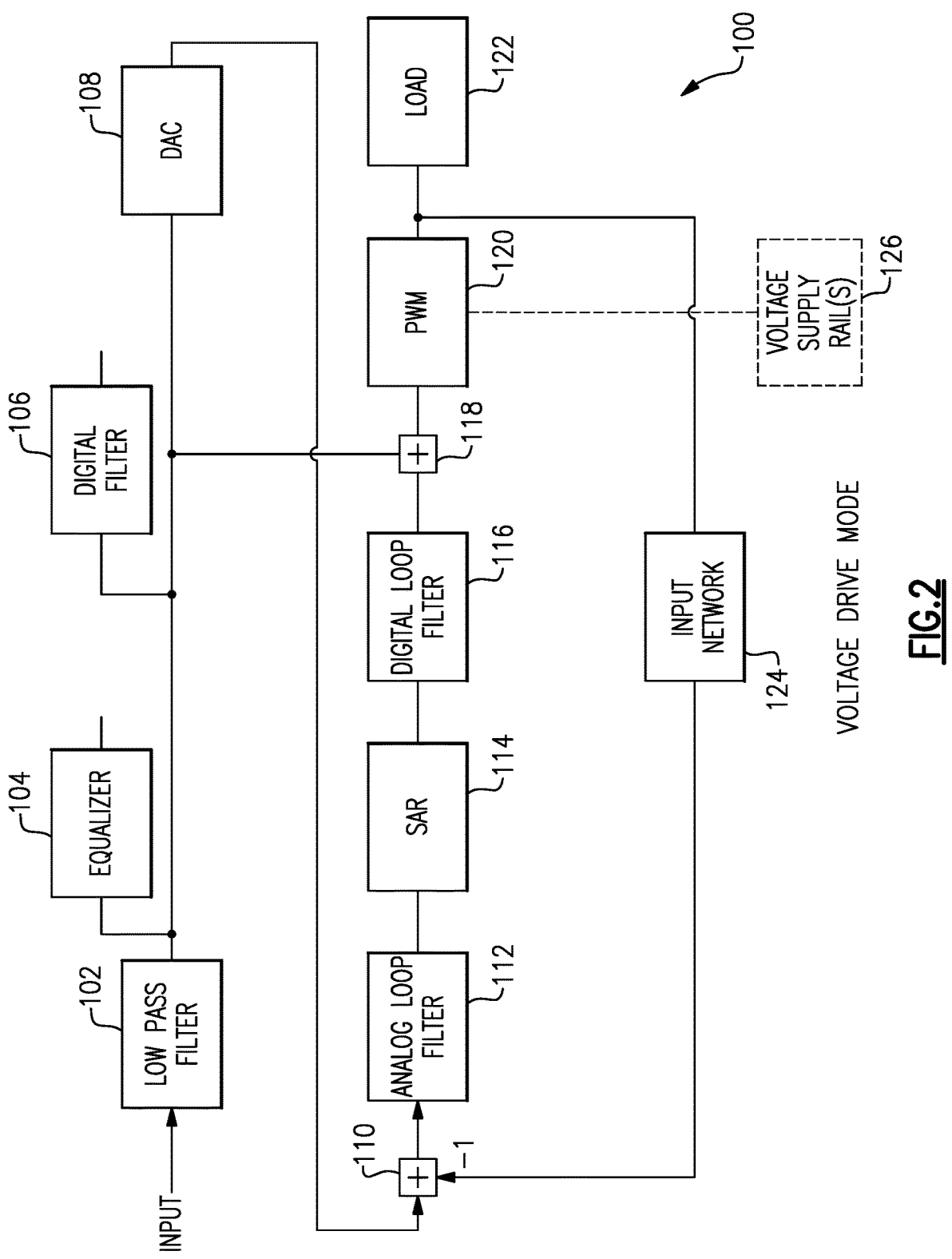
FIG. 2 illustrates a feedback loop in a voltage drive mode according to an example.

FIG. 1 illustrates a feedback loop 100 having a current drive mode and a voltage drive mode according to an embodiment. FIG. 2 illustrates the feedback loop 100 in the voltage drive mode, and FIG. 3 illustrates the feedback loop 100 in the current drive mode.

Figure 3:
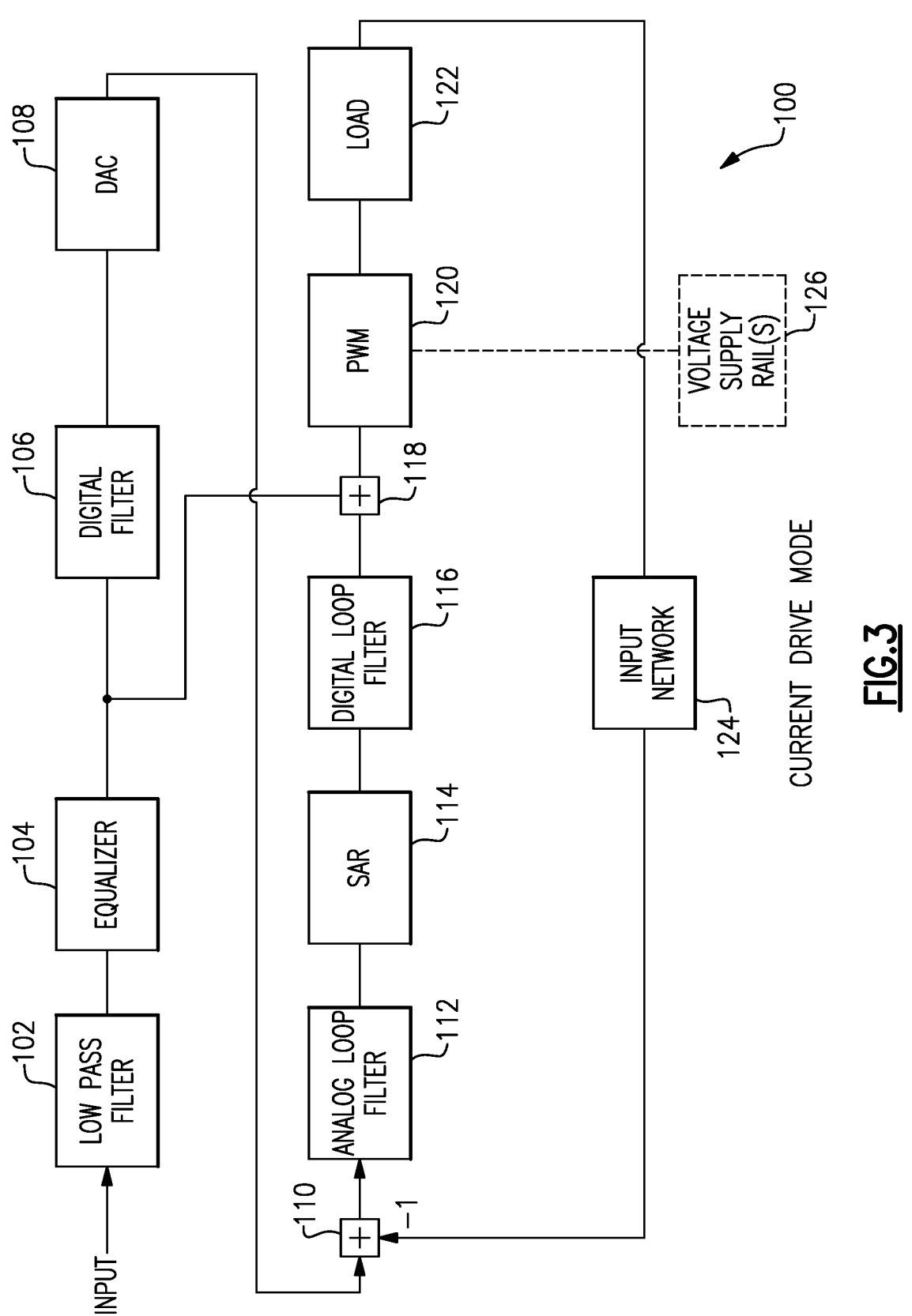
FIG. 3 illustrates a feedback loop in a current drive mode according to an example.

Each of FIGS. 1, 2, and 3 includes a low pass filter 102, an equalizer 104, a digital filter 106, a digital-to-analog converter (DAC) 108, a first summation node (first adder) 110, an analog loop filter 112, a successive approximation register analog-to-digital converter (SAR ADC) 114, a digital loop filter 116, a second summation node (second adder)

118, a pulse width modulator (PWM) 120, a load 122, and an input network 124. FIG. 1 further includes three switches, a first switch S1, a second switch S2, and a third switch S3. Also shown in each of FIGS. 1, 2, and 3 is an input where the input signal to the feedback loop 100 is provided.

The low pass filter 102 is coupled to the input, the equalizer 104, and the first switch S1. The equalizer 104 is coupled to the first switch S1. The first switch S1 is coupled to the digital filter 106, the second adder 118, and the second switch S2. The digital filter 106 is coupled to the second switch S2. The second switch S2 is coupled to the DAC 108. The DAC 108 is coupled to the first adder 110. The first adder 110 is coupled to the input network 124 and the analog loop filter 112. The analog loop filter 112 is coupled to the SAR ADC 114, and the SAR ADC 114 is coupled to the digital loop filter 116. The digital loop filter 116 is coupled to the second adder 118 as is the PWM 120. The PWM 120 is coupled to the load 122 and to the third switch S3. The load 122 is also coupled to the third switch S3. The third switch S3 is coupled to the input network 124.

The PWM 120 is also selectively coupled to one or more voltage supply rails 126 ("voltage supply rails 126"). The voltage supply rails 126 may provide different voltages (expressed as Vs1, Vs2, . . . , VsN, and so forth) to the PWM 120. For example, the PWM 120 may need to produce a signal of a given amplitude and width, however, the current voltage rail (e.g., Vs1) is too low (or too high) compared to the target voltage. The PWM 120 could then selectively couple to a different voltage supply rail (e.g., Vs2) that provides the correct voltage matching the desired amplitude of the pulse the PWM 120 is to provide.

The PWM 120 can provide pulses to the load 122, as will be discussed in more detail with respect to FIGS. 2 and 3, below. The PWM 120 may include a driver (such as an H-bridge, an amplifier, or another circuit topology) config-ured to drive the load 122. That is, the PWM 120 may include a driver that generates the pulses provided by the PWM 120 to the load 122. The PWM 120 may be configured to selectively couple to multiple voltage supplies and/or voltage supply rails, which will be referred to as voltage supplies for clarity. The PWM 120 may therefore select from among the voltage supplies available to it the voltage supply that will allow the driver of the PWM 120 to provide a pulse having a given amplitude corresponding to the voltage of the voltage supply. In some examples, the PWM 120 selects the voltage supply corresponding to the lowest voltage that allows the PWM 120 to supply the minimum amount of energy, relative to the other voltage supplies, to drive the load 122.

In some examples, feedback loop 100 and/or one or both of the analog loop filter 112 and/or digital loop filter 116 have characteristics that cause one or more of them to amplify high frequency components of the inputs provided to one or both of them. In some examples, the feedback loop 100 and/or one or both of the analog loop filter 112 and digital loop filter 116 may have poor phase margin that is, the feedback loop 100 may become unstable even due to a relatively small change in the open-loop phase of the system. The effect of amplification of the high frequency compo-nents and/or the poor phase margin of the system may include amplification of error components including high frequency error components (e.g., high frequency noise) that is reflected in the signal driven by the PWM 120 that drives the load 122. In practical terms, this means the load 122 may experience an error. In an audio application, for example, this may result in audible popping, clicking, hissing, or other noise or distortion.

In some examples, the load 122 acts as an RL filter (i.e., resistive-inductive low pass filter) of the first order. The digital filter 106 matches the filtering effect of the load 122, and thus may also be a first order low pass filter. More generally, the digital filter 106 may be the same order as the filtering effect of the load 122 and may be the same type (e.g., low-pass, band-pass, high-pass, and so forth). In many examples, the digital filter 106 is designed to have zero warping at the peaking frequency of the feedback loop 100 and to have small or minimal mismatch as the frequency of the input signal moves away from the peaking frequency of the feedback loop 100.

The three switches S1, S2, S3 determine the operation mode of the feedback loop 100 depending on their positions. In the voltage drive mode, the first switch S1 and second switch S2 couple the low pass filter 102 to the DAC 108 and to the second adder 118, while leaving the equalizer 104 and digital filter 106 floating, and the third switch S3 couples the PWM 120 to the input network 124. FIG. 2 illustrates the voltage drive mode according to an example, and shows the couplings of the components without the switches present.

In the current drive mode, the first switch S1 couples the low pass filter 102 to the equalizer 104 and couples the equalizer 104 to the digital filter 106 and the second adder 118. The second switch S2 couples the digital filter 106 to the DAC 108, and the third switch S3 couples the load 122 to the input network 124. FIG. 3 illustrates the current drive mode according to an example, and shows the couplings of the components without the switches present.

The switches may be implemented using transistors or other switching mechanisms, and may be controlled by a controller or a signal corresponding to the voltage and current drive modes.

FIG. 2 illustrates an example of the feedback loop 100 in the voltage drive mode. In this mode, self-regulation of the circuit is done using voltages and the output resistance of the load 122 is generally less than the output resistance of the load 122 in the current drive mode. The equalizer 104 and digital filter 106 are shown floating (that is, without an output) while the low pass filter 102 is shown coupled to the DAC 108 and both the DAC 108 and low pass filter 102 are shown coupled to the second adder 118. The PWM 120 is shown coupled to the input network 124 and the load 122.

In broad terms, the feedback loop 100 in the voltage drive mode uses signals that are summed together (e.g., at the first adder 110 and second adder 118) to control the PWM 120 such that the pulses provided by the PWM 120 to the load 122 and input network 124 are properly adjusted for feed-back, thus preserving the stability of the feedback loop 100 and eliminating unwanted error.

In the voltage drive mode, the input signal is received by the low pass filter 102, which filters the input signal, and provides the resulting filtered input signal to the DAC 108 and the second adder 118. The DAC 108 converts the filtered input signal from digital to analog form, and provides the resulting analog input signal to the first adder 110. The first adder 110 sums the analog input signal from the DAC 108 with the signal output by the PWM 120 through the input network 124. In some examples, the signal received from the input network 124 will be inverted, as indicated by the "−1" next to the first adder 110, meaning that the first adder 110 is subtracting the output signal from the input network 124 from the analog input signal received from the DAC 108. By subtracting the output of the PWM 120 from the output of the DAC 108, the error components of the signal are eliminated. In some examples, there is no energy at the first adder 110. The signal received from the input network may be inverted using any method, for example, by adjusting the gain and/or phase of the signal.

The resulting summed signal is provided by the first adder 110 to the analog loop filter 112. The analog loop filter 112 filters the summed signal and provides the resulting filtered summed signal to the SAR ADC 114. The SAR ADC 114 converts the filtered summed signal into a digital signal and provides the digital signal to the digital loop filter 116. The digital loop filter 116 filters the digital signal and provides the resulting filtered digital signal to the second adder 118.

As stated above, in many examples the filtered input signal is a digital signal. The second adder 118 sums the filtered input signal and the filtered digital signal and provides the resulting pulse control signal to the PWM 120. The PWM 120 receives the pulse control signal and uses it to determine (i.e., control) the width, amplitude, frequency, and/or other characteristics of the pulses the PWM 120 provides to the load 122 and input network 124. In some examples, the pulses are current pulses having a duration corresponding to the width of the pulse and an amplitude corresponding to the voltage of the pulse. In some examples, the amplitude of the pulses is determined by the PWM 120 connecting a given voltage supply to the pulse driver that produces the pulses. Differing voltage supplies may provide different voltages such that the amplitude is based on the voltage of the voltage supply. The input network 124 may be a resistor network that converts the pulse from a current into a measurable voltage that may be summed by the first adder 110 as described above.

By provisioning a pulse to the load 122, the PWM 120 can cause the load 122 to react. For example, if the load 122 is a speaker for an audio application, the membranes, magnets, and/or other components of the speaker may vibrate at certain frequencies and intensities based on the amplitude, width, and frequency of the provisioned pulses. This vibration may produce audible and/or inaudible sounds. However, the load may be anything and may make use of the pulses in other ways. The central concept is that the pulses provided by the PWM 120 act as control signals that control the load 122 to operate in various ways based on the width, amplitude, frequency, and/or other characteristics of the pulses.

FIG. 3 illustrates an example of the feedback loop 100 in the current drive mode. As mentioned previously, the current drive mode may be appropriate to use when the load 122 has a high inductance or the input signal has a large number of high frequency components (relative to the frequencies of the components of the voltage drive mode). This is because, in part, at high frequencies the load 122 may have a relatively higher impedance compared to low frequencies, provided the load 122 has an inductive component. The current drive mode may also be better for the load, for example, by driving the speaker in a more linear manner or by being less noisy compared to the voltage drive mode.

In the current drive mode, the low pass filter 102 is coupled to the equalizer 104, and the equalizer 104 is coupled to the digital filter 106 and to the second adder 118. The digital filter 106 is, in turn, coupled to the DAC 108.

The low pass filter 102 receives the input signal and filters it to produce a filtered input signal. The low pass filter 102 provides the filtered input signal to the equalizer 104. The equalizer 104 equalizes the filtered input signal 104 to ensure the frequency response of the filtered input signal is constant. In particular, the equalizer 104 ensures that the correct voltage drive is provided to the PWM 120. The equalized input signal is also provided by the equalizer 104 to the digital filter 106.

The digital filter 106 filters the equalized input signal to create a filtered signal to provide to the DAC 108. The digital filter 106 is designed and/or configured to match the frequency response of the load 122. For example, if the load 122 is a low pass filter with certain filtering characteristics, then the digital filter 106 is a low pass filter with identical filtering characteristics. The filtered signal of the digital filter 106 ensures that the DAC 108 has the correct current drive. The DAC 108 then provides an analog input signal to the first adder 110.

As a result, one signal (the equalized input signal) is provided to the second adder 118 and another signal (the analog input signal) is provided to the first adder 110. The ultimate effect of splitting the signal from the equalizer 104 through the digital filter 106 and second adder 118 is that the out of band pulse-density modulated noise that would otherwise be fed into the analog loop filter 112 is cancelled and thus is not boosted by the peaking and the load-inverse filtering of the digital loop filter 116.

The analog input signal is summed at the first adder 110 with the output of the input network 124. The input network 124 may be a resistor network that receives the output signal of the load 122 and converts the output signal of the load 122 into a voltage signal that may be summed with the analog input signal of the DAC 108 at the first adder 110. Like with the voltage drive mode, the first adder 110 may invert the output of the input network 124 such that the output signal of the load 122 is subtracted from the analog input signal of the DAC 108. The resulting summed signal is provided by the first adder 110 to the analog loop filter 112.

The analog loop filter 112 filters the summed signal to produce a filtered summed signal and provides the filtered summed signal to the SAR ADC 114. The SAR 114 ADC converts the filtered summed signal into a digital signal and provides the digital signal to the digital loop filter 116. The digital loop filter 116 filters the digital signal and provides the resulting filtered digital signal to the second adder 118.

The second adder 118 sums the equalized input signal and the filtered digital signal, and provides the resulting pulse control signal to the PWM 120. The PWM 120 uses the pulse control signal to determine the amplitude, width, and frequency of the pulses the PWM 120 provides to the load 122. As with the voltage drive mode, the pulses provided to the load 122 by the PWM 120 may have amplitudes corresponding to a voltage, a width corresponding to a duration for a given pulse, and a frequency. As with the voltage drive mode, each of these characteristics (amplitude, width, frequency) may be based on the pulse control signal received from the second adder 118.

Figure 4:
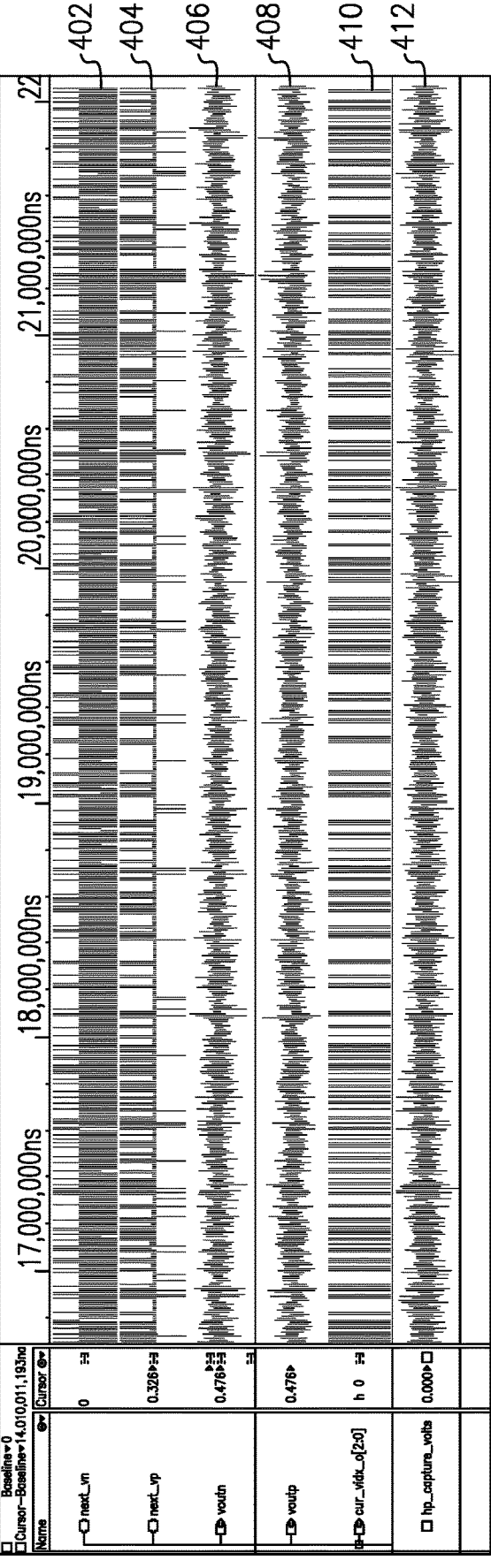
FIG. 4 illustrates the input and output signals related to the feedback loop according to an example.
Figure 5:
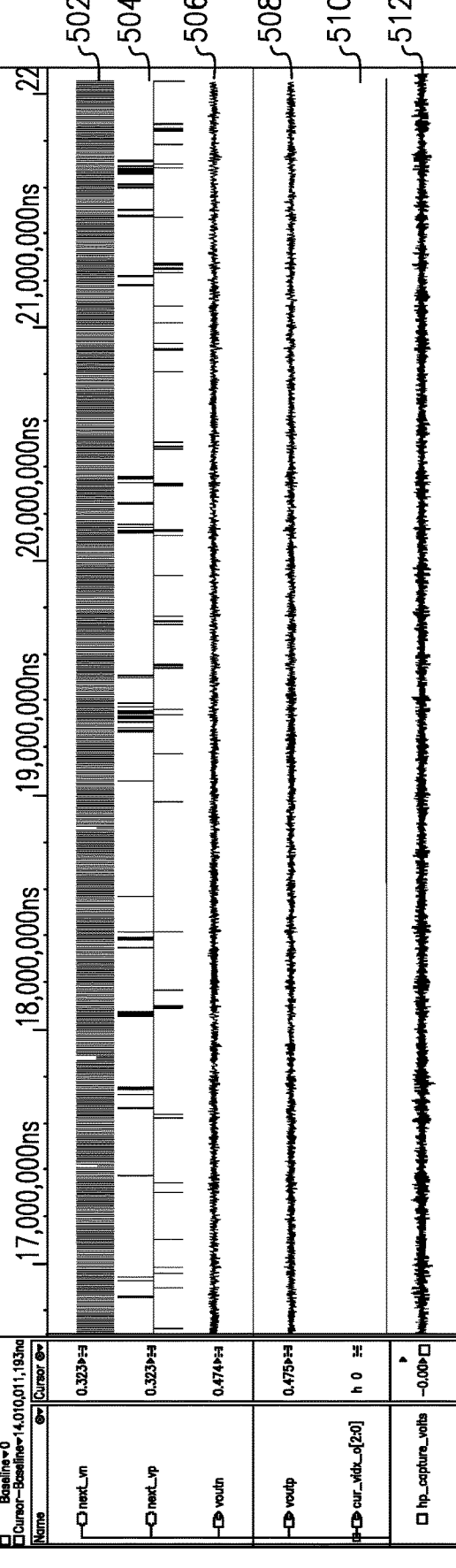
FIG. 5 illustrates the input and output signals related to the feedback loop according to an example.

FIGS. 4 and 5 illustrate a comparison of input and output signals to a loop filter 100 in a current drive mode (i.e., as shown in FIG. 3) according to examples. In FIG. 4, the digital filter 106 is not present (or is combined with the equalizer 104), such that the equalizer 104 provides its output directly to the DAC 108 and the second adder 118. In FIG. 5, by comparison, the digital filter 106 is present, such that the equalizer 104 provides its output to the digital filter 106 and the second adder 118.

As FIGS. 4 and 5 demonstrate, the example wherein the loop filter 100 lacks the digital filter 106 (or when the digital filter is incorporated as part of the equalizer 104), the amount of noise, and the amount of switching between voltage supplies to meet the power requirements of the PWM 120 is much greater than when the digital filter 106 is included (or, alternatively, when the equalizer 104 is split into the equalizer 104 and the digital filter 106).

FIG. 4 includes a positive PWM trace 402, a negative PWM trace 404, a first analog loop filter trace 406, a second analog loop filter trace 408, a rail trace 410, and an output trace 412. FIG. 5 includes corresponding traces, including a positive PWM trace 502, a negative PWM trace 504, a first analog loop filter trace 506, a second analog loop filter trace 508, a rail trace 510, and an output trace 512.

The positive PWM traces 402, 502 and negative PWM traces 404, 504 show the positive and negative outputs of the PWM 120, respectively. The output traces 412, 512 show the differential between the positive PWM traces 402, 502 and the negative PWM traces 404, 504 when the differential is put through a low pass filter to remove most of the high frequency pulse energy (e.g., a 100 kHz low pass filter to remove most 3 MHz pulse energy components).

The analog loop filter traces 406, 408, 506, 508 show the output of the analog loop filter 112. The rail traces 410, 510 show which voltage rail is providing voltage to the PWM 120. That is, the rail traces 410, 510 show a binary change between 0 and 1, with 0 corresponding to a first, low voltage rail, and 1 corresponding to a second, higher voltage rail. However, the number of rails is not limited to two: any number of voltage rails having different voltages may be used. For the sake of the example and clarity, only two voltages are provided. The first voltage rail may provide a voltage that is less than the voltage provided by the second voltage rail.

It is immediately apparent that FIG. 4 shows traces with more activity than the traces of FIG. 5. In particular, the positive and negative PWM traces 402, 404 are considerably more active in FIG. 4, and thus indicate that the PWM 120 output is more active and uses more energy and power, and has more error (e.g., noise) compared to the positive and negative PWM traces 502, 504 of FIG. 5. Therefore, the PWM 120 uses less power, is less active, and has fewer error components when the digital filter 106 is present (or split from the equalizer 104) compared to when the digital filter 106 is not present (or is incorporated into the equalizer 104). For the sake of clarity, the digital filter 106 not being present shall be understood to mean at least either (1) the digital filter 106 not being part of the circuit or (2) the digital filter 106 being incorporated into the equalizer 104.

The first and second analog loop filter traces 406, 408 in FIG. 4 show that the analog loop filter 112 is more active, and therefore has more and/or larger error components, compared to the first and second analog loop filter traces 506, 508 in FIG. 5. This again shows that the analog loop filter 112 uses less power and energy and has fewer error components when the digital filter 106 is present compared to when the digital filter 106 is not present.

The rail traces 410, 510 show that the PWM 120 switches between rail voltages less frequently when the digital filter 106 is present compared to when the digital filter 106 is not present. As a result, since switching between voltage rails can cause sudden changes in voltage at the PWM 120 output, and those sudden changes in voltage can cause error (e.g., noise), not to mention that using a higher voltage rail consumes more power and energy in many examples, the digital filter 106 thus reduces energy consumption and error by reducing the need of the PWM 120 to switch between voltage rails. In some examples, the digital filter 106 effectively eliminates the need for the PWM 120 to switch between supply rails under certain conditions.

In some examples, the presence of digital filter 106 will prevent (or eliminate the need) to switch rail voltages within certain power ranges or below a power threshold. In one example, the PWM 120 will not switch voltage supplies for output signals (to the load 122) of less than 100 micro-Watts (100 μW). In other examples, the power threshold may be any value. The power threshold may be determined by the design choices of the engineer implementing the feedback loop 100.

The output traces 412, 512 show that the high frequency error (e.g., noise) at the load is much greater and consumes much more power when the digital filter 106 is not present compared to when the digital filter 106 is present. The output traces 412, 512 also show that there is less high frequency noise when the digital filter 106 is present compared to when the digital filter 106 is not present.

By splitting the equalizer 104 as described above that is, by having a separate equalizer 104 and digital filter 106 before the DAC 108 considerable power savings and error reduction can be achieved in the current drive mode.

However, in some examples, one disadvantage to including the digital filter 106 is that the equalizer 104 cannot receive the filtered output of the digital filter 106 as an input. That is, in the current drive mode as illustrated in FIG. 3, some filtering is done on the path between the equalizer 104 and the DAC 108 by the digital filter 106. This means that the equalizer 104 cannot receive the filtered signal provided by the digital filter 106 to the DAC 108. This represents a significant disadvantage because the equalizer, if implemented external to a chip housing other portions of the feedback loop 100 (e.g., if the low pass filter 102 and equalizer 104 are implemented externally to the rest of the feedback loop 100), needs to determine the equalization function by independently determining the response of the DAC filter and removing the effects of the DAC filter from the equalization function.

Figure 6:
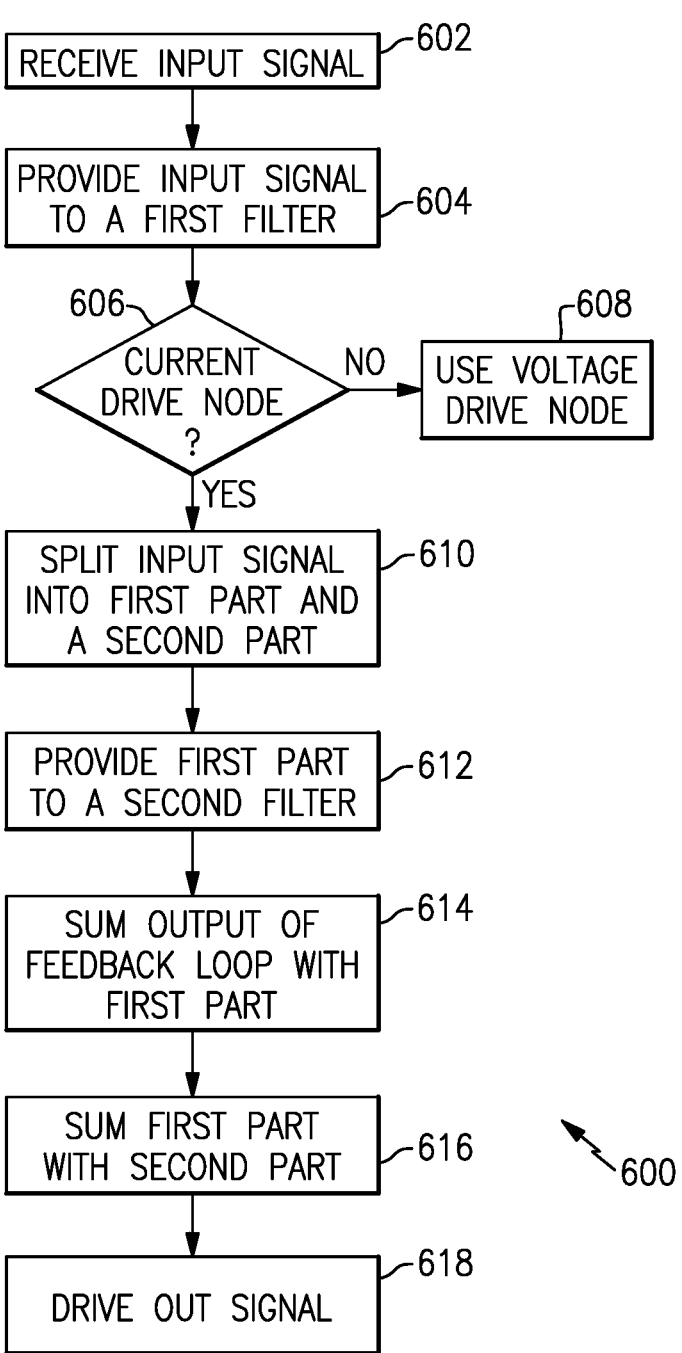
FIG. 6 illustrates a process for filtering a signal according to an example.

FIG. 6 illustrates a process 600 for filtering a signal according to an example. For the purpose of clarity, reference will be made to the components of the feedback loop 100 in the following discussion of the process 600.

At act 602, the feedback loop 100 receives an input signal. The input signal may be a digital or analog signal, but will, in some examples, be a digital signal. The process 600 may then proceed to act 604.

At act 604, the input signal is provided to a first filter. The first filter may have various filtering characteristics determined by an engineer or designer. In some examples, the first filter will be the equalizer 104 and/or the low pass filter 102. The process 600 then proceeds to act 606.

At act 606, a controller determines whether the feedback loop 100 is in a current drive mode or voltage drive mode. If the feedback loop 100 is not in a current drive mode (606 NO), the process continues to act 608. If the feedback loop is in a current drive mode (606 YES), the process continues to act 610. In some examples, the controller may be the PWM 120 or may be a separate controller configured to control the feedback loop 100.

At act 608, the controller operates the feedback loop 100 in the voltage drive mode. In some examples, the controller may control the switches S1, S2, S3 to switch into positions corresponding to the voltage drive mode.

At act 610, the controller operates the feedback loop 100 in the current drive mode. In some examples, the controller may control the switches S1, S2, S3 to switch into positions corresponding to the current drive mode. The input signal is provided by the first filter to a node where the input signal is split into a first part and a second part. The second part is provided to a summation node. The process 600 then proceeds to act 612.

At act 612, the first part is provided to a second filter. The second filter may filter the first part to match the output signal of the load 122. In some examples, the second filter may be the digital filter 106 and/or the DAC 108. The process then continues to act 614.

At act 614, the first part is summed with the output of the load 122. The output of the load 122 may, in some examples, be inverted, such that the summing of the first part with the output involves subtracting the output from the first part. In some examples, the energy left over as a result of the summing described here will be at or near zero, or will be at or near zero with respect to a given frequency range (e.g., a high frequency range or a low frequency range). The process then proceeds to act 616.

At act 616, the first part is summed with the second part, and the resulting summed signal is provided to drive the load. In some examples, the summed signal is provided to the PWM 120, and the PWM 120 uses the summed signal to generate pulses to drive the load 122. The first part will be the first part from act 614 that is, the first part will have had the output subtracted from it. In some examples, the controller may control the PWM 120 based on the summed signal to generate the pulses used to drive the output. The controller and/or PWM 120 may switch between voltage supplies to provide pulses having sufficient energy to drive the load 122. The process 600 then proceeds to act 618.

At act 618, the pulses generated by the PWM 120 drive the output signal at the load 122. In some examples, the output signal is also provided to the feedback loop 100 to be summed with the first part (e.g., as described with respect to act 614).

In the foregoing, the filters, such as the digital filter 106 or analog loop filter 112 or other filters discussed herein, may be optimized prior to implementation to select the best tap coefficients for the given filter. That is, while the digital filter 106 may be a low pass filter, the tap coefficients of the digital filter 106 may be preselected (i.e., optimized) such that the filtering characteristics of the digital filter 106 match the filtering characteristics of the load 122. The other filters may be similarly optimized according to the desires or needs of the loop filter 100.

Various controllers, such as the controller of FIG. 6, may execute various operations discussed above. The controller and/or controllers may be processors, microprocessors, ASICs, FPGAs, or any other type of circuit configured to control operations of the feedback loop. Using data stored in associated memory and/or storage, the controller also executes one or more instructions stored on one or more non-transitory computer-readable media, which the controller may include and/or be coupled to, that may result in manipulated data. In some examples, the controller may include one or more processors or other types of controllers. In one example, the controller is or includes at least one processor. In another example, the controller performs at least a portion of the operations discussed above using an application-specific integrated circuit tailored to perform particular operations in addition to, or in lieu of, a general-purpose processor. As illustrated by these examples, examples in accordance with the present disclosure may perform the operations described herein using many specific combinations of hardware and software and the disclosure is not limited to any particular combination of hardware and software components. Examples of the disclosure may include a computer-program product configured to execute methods, processes, and/or operations discussed above. The computer-program product may be, or include, one or more controllers and/or processors configured to execute instructions to perform methods, processes, and/or operations discussed above.

Having thus described several aspects of at least one embodiment, it is to be appreciated various alterations, modifications, and improvements will readily occur to those skilled in the art. Such alterations, modifications, and improvements are intended to be part of, and within the spirit and scope of, this disclosure. Accordingly, the foregoing description and drawings are by way of example only.

What is claimed is:

1. A feedback loop circuit for an electrical signal, the feedback loop comprising:

an input;

a first branch coupled to the input, the first branch having a first switch and a second switch, the first branch configured to receive an input signal from the input and to provide a first signal based on the input signal to a first adder and to provide a second signal based on the input signal to a second adder; and a second branch having a feedback line coupled between a third switch and the first adder, the second branch configured to provide an output signal based on the first signal and the second signal to a load.

2. The feedback loop of claim 1 wherein the output signal is further based on a first summed signal and a second summed signal, the first summed signal being based on the output signal and the first signal, and the second summed signal being based on the first summed signal and the second signal.

3. The feedback loop of claim 1 wherein the first branch further comprises an equalizer to produce the second signal based on the input signal; and a digital filter to provide to a digital-to-analog converter (DAC) a filtered signal based on the second signal and at least one filtering characteristic of the load, the DAC being configured to convert the filtered signal into an analog signal and provide the analog signal to the first adder as the first signal.

4. The feedback loop of claim 3 wherein the second branch comprises the first adder and the second adder;

a filtering block coupled between the first adder and the second adder, the filtering block to filter the first summed signal and convert the first summed signal into a digital first summed signal, and provide the digital first summed signal to the second adder;

a pulse width modulator (PWM) to provide the drive signal to the load based on the sum, at the second adder, of the digital first summed signal and the second signal; and an input network configured to receive the output signal and provide the output signal to the first adder.

5. The feedback loop of claim 4 wherein the filtering block comprises an analog loop filter coupled to the first adder, a successive approximation register analog-to-digital converter (SAR ADC) coupled to the analog loop filter, and a digital loop filter coupled to the SAR ADC and to the second adder.

6. The feedback loop of claim 4 further comprising a controller configured to control the first, second, and third switches, wherein controlling the first, second, and third switches includes controlling the first switch to be in a respective first position or a second position, the second switch to be in a respective first position or second position, and the third switch to be in a respective first position or second position.

7. The feedback loop of claim 6 wherein, in a current drive mode, the controller controls the first switch to couple the equalizer to the second adder, controls the second switch to couple the digital filter to the DAC, and controls the third switch to couple the PWM to the input network.

8. The feedback loop of claim 6 wherein, in the voltage drive mode, the controller controls the first switch to decouple an output of the equalizer from the second adder, decouple an output of the digital filter from an input of the DAC, and couple the load to the input network.

9. The feedback loop of claim 2 wherein the first adder is configured to subtract the output signal from the first signal to produce the first summed signal.

10. A method for maintaining stability of a feedback loop circuit comprising:

receiving an input signal;

splitting the input signal into a first part and a second part;

processing the first part with a digital filter having at least one filtering characteristic based on one or more filtering characteristics of a load;

combining the first part with an output signal to produce a first summed signal;

combining the second part with the first summed signal to produce a drive signal;

passing the input signal through an equalizer to produce the second part; and passing the second part through the digital filter to produce the first part; and driving a pulse width modulator (PWM) using the drive signal.

11. The method of claim 10 further comprising converting the first part from digital to analog form;

combining the first part in analog form with the output signal in analog form to produce the first summed signal;

converting the first summed signal from analog to digital form; and combining the first summed signal in digital form with the second part to produce the drive signal.

12. The method of claim 10 wherein the PWM drives a load, and the load produces the output signal.

13. The method of claim 10 wherein combining the first part and the output signal includes subtracting the output signal from the first part.

14. The method of claim 13 further comprising inverting the output signal.

15. The method of claim 10 further comprising converting the output signal from a current to an analog voltage waveform using an input network.

16. A feedback loop for reducing noise in an output signal provided by a pulse width modulator (PWM), the feedback loop comprising:

an input configured to receive an input signal;

a plurality of supply rail connections selectively coupled to the PWM and configured to provide power to the PWM;

an equalizer coupled to an adder, the equalizer configured to provide an equalized signal based on the input signal;

a digital loop filter selectively coupled to a digital-to-analog converter (DAC), the digital loop filter configured to provide a filtered signal based on the equalized signal, the adder being further configured to provide a drive signal to the PWM based on the equalized signal, the filtered signal, and the output signal; and a controller configured to control the plurality of supply rail connections to selectively couple to the PWM based on an energy of the output signal.

17. The feedback loop of claim 16 wherein plurality of supply rail connections includes a first supply rail connection corresponding to a first voltage and a second supply rail connection corresponding to a second voltage, the second voltage being greater than the first voltage, and the controller controls the first supply rail connection to selectively couple to the PWM responsive to the power of the output signal being below a threshold power level, and the controller controls the second supply rail connection to selectively couple to the PWM responsive to the power of the output signal being above a threshold power level.

18. The feedback loop of claim 17 wherein the digital loop filter has a response characteristic matching a response characteristic of a load coupled to the PWM.

19. The feedback loop of claim 18 wherein the digital loop filter's response characteristic reduces noise in the circuit, thereby reducing a frequency of the power of the output signal exceeding the threshold power level.

* * * * *